US009449855B2

(12) United States Patent
Yim et al.

(10) Patent No.: US 9,449,855 B2
(45) Date of Patent: Sep. 20, 2016

(54) DOUBLE-ETCH NANOWIRE PROCESS (71) Applicant: Advanced Silicon Group, Inc., Lincoln, MA (US)

(72) Inventors: Joanne Yim, San Francisco, CA (US); Jeffrey B. Miller, Brookline, MA (US); Michael Jura, Santa Monica, CA (US); Marcie R. Black, Lincoln, MA (US); Joanne Forziati, Everett, MA (US); Brian P. Murphy, Revere, MA (US); Adam Standley, Cambridge, MA (US)

(73) Assignee: ADVANCED SILICON GROUP, INC., Lincoln, MA (US)

( * ) Notice: Subject to any disclaimer, the term of this patent is extended or adjusted under 35 U.S.C. 154(b) by 0 days.

(21) Appl. No.: 14/329,975

(22) Filed: Jul. 13, 2014

(65) Prior Publication Data

US 2015/0017802 A1    Jan. 15, 2015

Related U.S. Application Data (60) Provisional application No. 61/845,931, filed on Jul. 12, 2013.

(51) Int. Cl.

| H01L 21/48 | (2006.01) |
|---|---|
| H01L 21/308 | (2006.01) |
| H01L 21/02 | (2006.01) |
| H01L 29/06 | (2006.01) |
| H01L 29/41 | (2006.01) |
| H01L 21/306 | (2006.01) |
| C30B 29/06 | (2006.01) |
| C30B 29/60 | (2006.01) |
| H01M 4/38 | (2006.01) |
| H01M 10/0525 | (2010.01) |

(52) U.S. Cl.
CPC .......... *H01L 21/4885* (2013.01); *C30B 29/06* (2013.01); *C30B 29/60* (2013.01); *H01L 21/02603* (2013.01); *H01L 21/308* (2013.01); *H01L 21/3081* (2013.01); *H01L 21/3086* (2013.01); *H01L 21/3088* (2013.01); *H01L 21/30604* (2013.01); *H01L 29/0669* (2013.01); *H01L 29/0676* (2013.01); *H01L 29/413* (2013.01); *H01M 4/386* (2013.01); *H01L 2924/0002* (2013.01); *H01M 10/0525* (2013.01)

(58) Field of Classification Search
CPC ................... H01L 21/02603; H01L 29/0669; H01L 29/413; H01L 21/3081; H01L 21/3083; H01L 21/3086; H01L 21/3088; H01L 21/30604; H01M 4/836
See application file for complete search history.

(56) References Cited

U.S. PATENT DOCUMENTS

| 7,893,512 B2 | 2/2011 | Black |
|---|---|---|
| 8,143,143 B2 | 3/2012 | Buchine et al. |
| 2009/0256134 A1* | 10/2009 | Buchine ................. B01J 20/10 257/9 |
| 2011/0024169 A1 | 2/2011 | Buchine et al. |
| 2012/0164529 A1 | 6/2012 | Bahr et al. |

OTHER PUBLICATIONS

Allon I. Hochbaum et al., "Enhanced thermoelectric performance of rough silicon nanowires," Nature, vol. 451, p. 163 (2008).
Akram I. Boukai et al., "Silicon nanowires as efficient thermoelectric materials," Nature, vol. 451, p. 168 (2008).
Zhen Li et al., "Semiconductor nanowires for thermoelectrics," J. Materials Chemistry, vol. 22, 22821 (2012).

\* cited by examiner

*Primary Examiner* — Thanhha Pham
(74) *Attorney, Agent, or Firm* — Lando & Anastasi, LLP (57) ABSTRACT

In an aspect of this disclosure, a method is provided comprising the steps of: (a) providing a silicon-containing substrate, (b) depositing a first metal on the substrate, (c) etching the substrate produced by step (b) using a first etch, and (d) etching the substrate produced by step (c) using a second etch, wherein the second etch is more aggressive towards the deposited metal than the first etch, wherein the result of step (d) comprises silicon nanowires. The method may further comprise, for example, steps (b1) subjecting the first metal to a treatment which causes it to agglomerate and (b2) depositing a second metal.

20 Claims, 6 Drawing Sheets

DOUBLE-ETCH NANOWIRE PROCESS

CROSS-REFERENCE TO RELATED APPLICATIONS

This application claims priority to U.S. Provisional application Ser. No. 61/845,931, filed Jul. 12, 2013, which is incorporated herein by reference.

BACKGROUND OF THE INVENTION

Nanowire arrays are seeing increasing use in a variety of applications. See, e.g., U.S. Published Patent Application No. 2009/256134. An exemplary silicon nanowire array might consist of a collection of silicon nanowires, on the rough order of 100 nm in diameter, on the rough order of one micrometer in height, and of approximately cylindrical or frustoconical shape. The axes of the nanowires run approximately parallel to each other. Each is attached at an end to a silicon substrate. This structure is exemplary: there is also interest in other types of nanowires, which may for example comprise materials other than silicon, have axes oriented at angles to each other, or be randomly arranged, and which may not be attached to a silicon substrate.

It is becoming common to produce nanowire arrays by various forms of metal-enhanced etching. Naturally, in order for metal-enhanced etching to be part of a production process, many specific parameters may need to be controlled so as to produce nanowire arrays having the characteristics required for particular applications with characteristics having a suitably limited variation from batch to batch.

There is a need for nanowire array production processes which are more controllable and allow for easier and more efficient production of nanowire arrays having specific characteristics desired in applications.

SUMMARY OF THE INVENTION

A method is provided comprising the steps of: (a) providing a silicon-containing substrate, (b) depositing a first metal on the substrate, (c) etching the substrate produced by step (b) using a first etch, and (d) etching the substrate produced by step (c) using a second etch, wherein the second etch is more aggressive towards the deposited metal than the first etch, wherein the result of step (d) comprises silicon nanowires.

DETAILED DESCRIPTION OF THE INVENTION

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

Where a range of values is provided, it is intended that each intervening value between the upper and lower limit of that range and any other stated or intervening value in that stated range is encompassed within the disclosure. For example, if a range of 1 µm to 8 µm is stated, it is intended that 2 µm, 3 µm, 4 µm, 5 µm, 6 µm, and 7 µm are also disclosed, as well as the range of values greater than or equal to 1 µm and the range of values less than or equal to 8 µm.

A method is provided comprising the steps of: (a) providing a silicon-containing substrate, (b) depositing a first metal on the substrate, (c) etching the substrate produced by step (b) using a first etch, and (d) etching the substrate produced by step (c) using a second etch, wherein the second etch is more aggressive towards the deposited metal than the first etch, wherein the result of step (d) comprises silicon nanowires. The method may further comprise, for example, steps (b1) subjecting the first metal to a treatment which causes it to agglomerate and (b2) depositing a second metal.

In processes of the disclosure, the silicon-containing substrate may be, for example, a wafer of single-crystal silicon, a wafer of polycrystalline silicon, a wafer of amorphous silicon, or a wafer or other generally flat object of a different material on which silicon has been deposited or bonded.

In processes of the disclosure, the deposition steps may use a variety of known techniques for the deposition of metals, for example evaporation, sputtering, electrodeposition, electroless deposition, or chemical vapor deposition.

In processes of the disclosure, a variety of treatments may be employed for the step of agglomerating the first deposited metal. The agglomeration step may be carried out, for example, by heating the substrate with the initially deposited metal on it. The heating may take place in a chamber used for deposition, for example in the sputtering tool if the first metal deposition was through sputtering. The heating may alternatively take place in a separate chamber or oven. The heating may be carried out, for example, at a temperature of at least about 200° C., at least about 250° C., at least about 300° C., at least about 350° C., or at least about 400° C. The heating may be carried out, for example, for a time on the order of minutes, for example between about 1 and about 15 minutes, about 2 and 10 minutes, or about 3 and 7 minutes. The heating may be carried out in a liquid bath.

In processes of the disclosure, a variety of etches may be employed. Etches which use a solution of HF and an oxidant, for example, may be employed. Etches which are assisted by the metal, for example, with the metal acting as a catalyst, may be employed. The aggressiveness of the etch may be varied, for example, by varying the strength of the oxidant. The duration of etching may be varied, for example, to vary the dimensions of the nanowires.

Processes of the disclosure may, for example, be followed by additional etching to remove the deposited metal.

Figure 6:
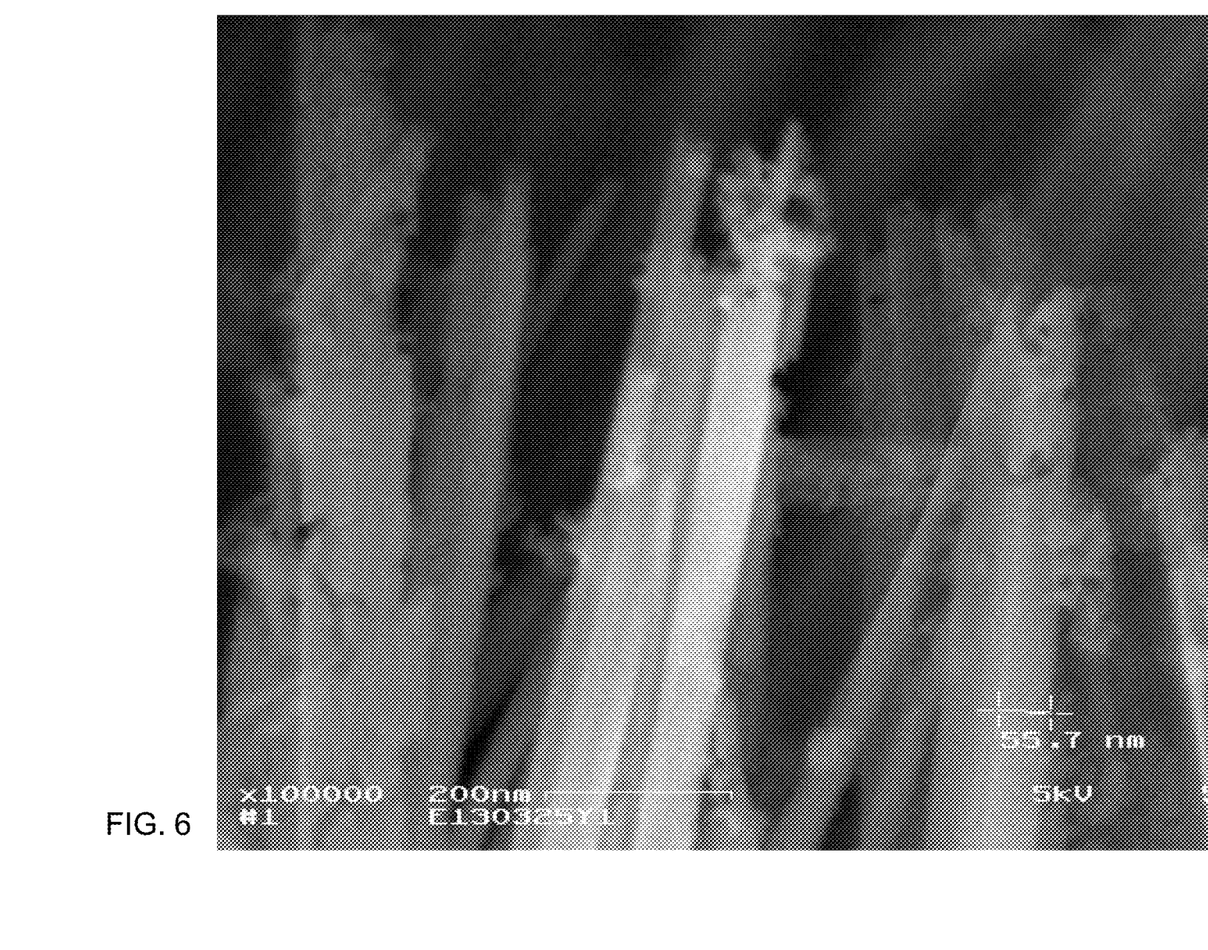
FIG. 6 is an SEM depicting nanowires produced by a metal-assisted etching process without two separate etching steps.

Processes of the disclosure may be used to avoid some of the following drawbacks seen in certain metal-assisted etching processes. (i) Sometimes these processes result in undesirably tapered nanowires as the metal is etched or flakes off during the etch. (ii) In addition, sometimes metal-assisted etching processes leave porous silicon on the tips of the nanowires, as is observed for example in SEMs of those nanowires such as FIG. 6. (iii) In addition, use of an etch solution with bubbled oxygen has advantages but tends to slow down the nanowire formation process compared to etch solutions with more aggressive oxidizers.

For nanowires produced by processes of the disclosure, figures of merit include the ratio of the long dimension to the shorter dimensions of the wire, such as the diameter of a cross section of the nanowire in a plane perpendicular to the long direction. These ratios may be, for example, at least about 3:1, at least about 10:1, at least about 30:1, at least about 100:1, or at least about 300:1.

Further figures of merit may be based on the dimensions of a section of the nanowire in a plane perpendicular to the long dimension of the nanowire. This section is a plane figure which may vary along the long dimension. It may or may not be convex. The roundedness of this section may be quantified, for example, by determining its center and then examining the ratio of the longest and shortest chord passing through the center. This ratio may be, for example, no greater than about 10, no greater than about 5, or no greater than about 2.

The variation of the section of the nanowire as one varies the position along its long dimension may, for example, be quantified by observing the variation of the diameter of that section, which is also referred to by those of skill in the art as the nanowire's taper. The diameter may, for example, vary by no more than about 0.1%, no more than about 0.3%, no more than about 1%, or no more than about 3% along the nanowire's long dimension. Alternatively, the taper may be described, for example, by taper angles. Desirable taper angles might be, for example, no more than about 0.5 degrees, about 1 degree, about 2 degrees, about 4 degrees, or about 10 degrees, or in a range between about 0.5 degrees and about 1 degree, about 2 degrees, about 4 degrees, or about 10 degrees.

As will be understood, if a nanowire is quite long, even though it has a very small taper, its cross-sectional diameter will eventually diminish considerably. Furthermore, towards the base of the nanowire, i.e., the place where it makes contact with the substrate, the taper will cause the base to be rather broad. It is observed that in processes of the disclosure the bases of adjacent nanowires may merge into each other. Thus adjacent nanowires may, for example, be attached to each other for the first 10 nm, 30 nm, or 100 nm. It is also observed that, in some processes of the disclosure, nanowires meet at their tips and/or bend to form arches.

These figures of merit have been considered in relation to a single nanowire. While it is often desirable to make nanowires of identical characteristics, in practice there will be variations, for which reason one speaks of the nanowires resulting from a particular process as predominantly meeting a figure of merit or of the majority of nanowires meeting that figure of merit. It is also possible that there could be nanowires grown or etched on a substrate that do not result from a process of this disclosure together with other nanowires which do result from such a process. In appropriate cases, the figures of merit like maximum taper may be understood to apply to the nanowires produced by processes of this disclosure and not necessarily to nanowires by different processes.

The nanowires of this disclosure may be formed with their long dimensions at different angles to a substrate surface, for example at angles predominantly no more than about 45 degrees, no more than about 20 degrees, or no more than about 10 degrees from a line perpendicular to the substrate surface. They may also be grown at smaller angles than 10 degrees to such a line perpendicular to the substrate surface, or they may be predominantly perpendicular to that surface. They may, for example, vary in the angle they make within the range stated.

The nanowires of this disclosure may be formed at a variety of lengths, for example lengths in excess of about 1 µm, 3 µm, 10 µm, 30 µm, or 50 µm. They may also be formed at a variety of densities, for example at least about 10 nanowires per µm$^2$, at least about 30 nanowires per µm$^2$, or at least about 100 nanowires per µm$^2$.

Processes of the disclosure may produce nanowires with surface roughness which may make them more suitable, for example, for thermoelectric applications in which surface roughness is sometimes sought after. Surface roughness may be perceived and quantified, for example, visually in an SEM, for example as a count of indentations per µm$^2$ of surface area, for example at least about 10 visible indentations per µm$^2$ of surface area, or at least about 100 visible indentations per µm$^2$ of surface area, or at least 1000 visible indentations per µm$^2$ of surface area.

Figure 3:
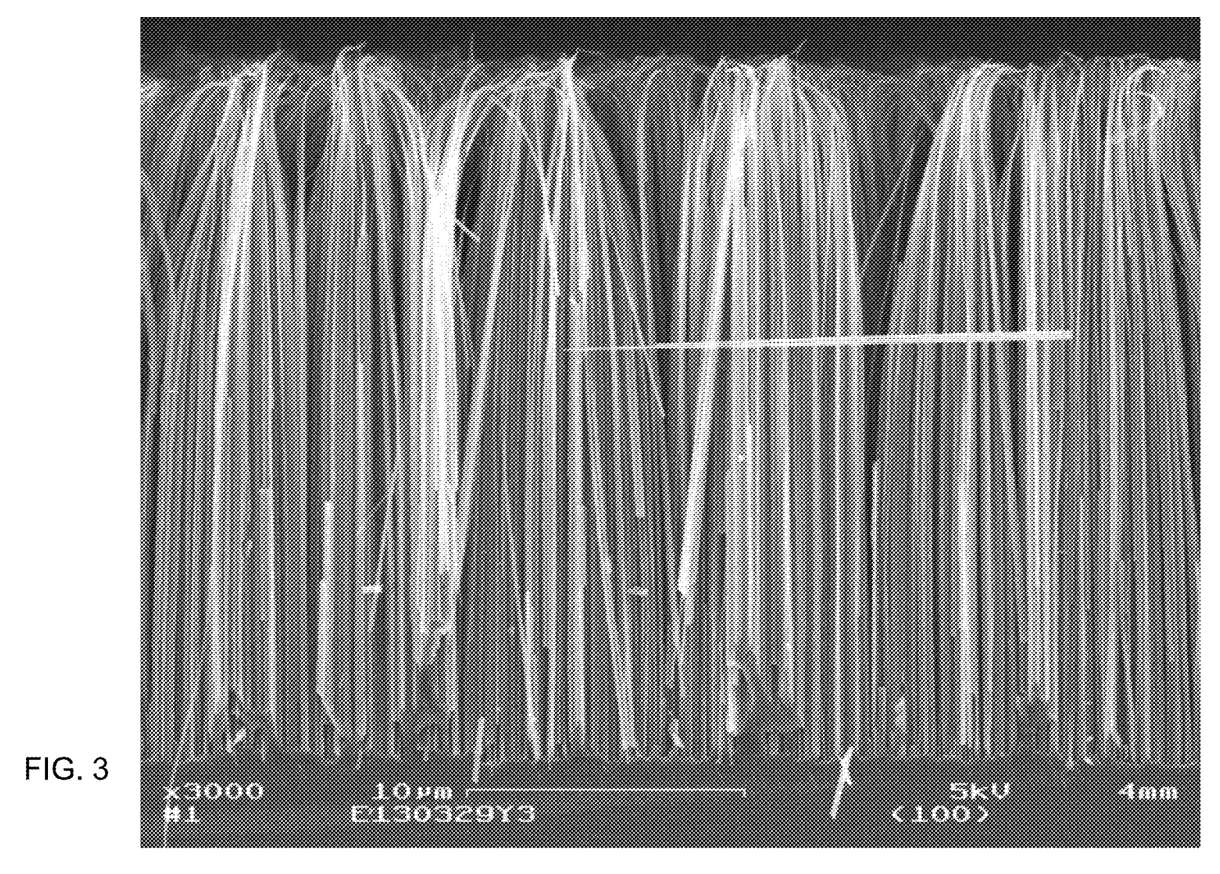
FIG. 3 is an SEM of nanowires produced by the first exemplary process described below.
Figure 4:
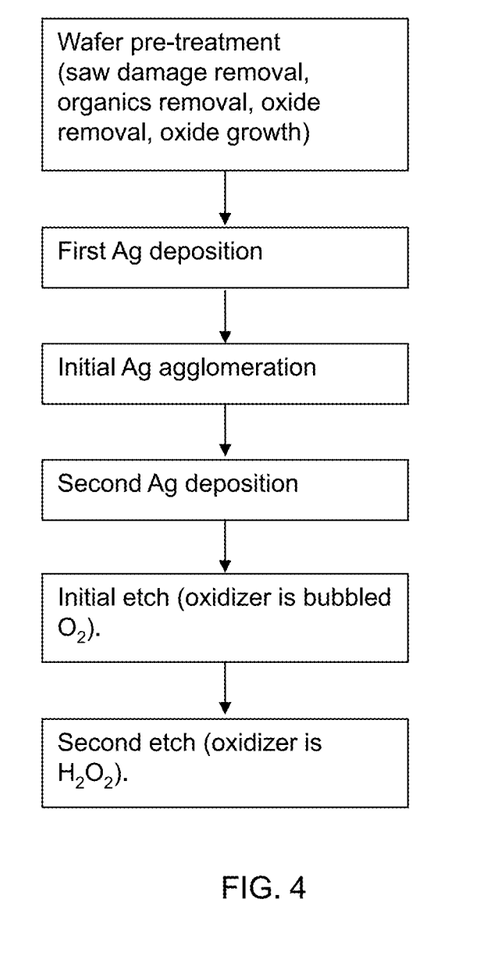
FIG. 4 is a flowchart which in simplified form shows an exemplary process of this disclosure.
Figure 5:
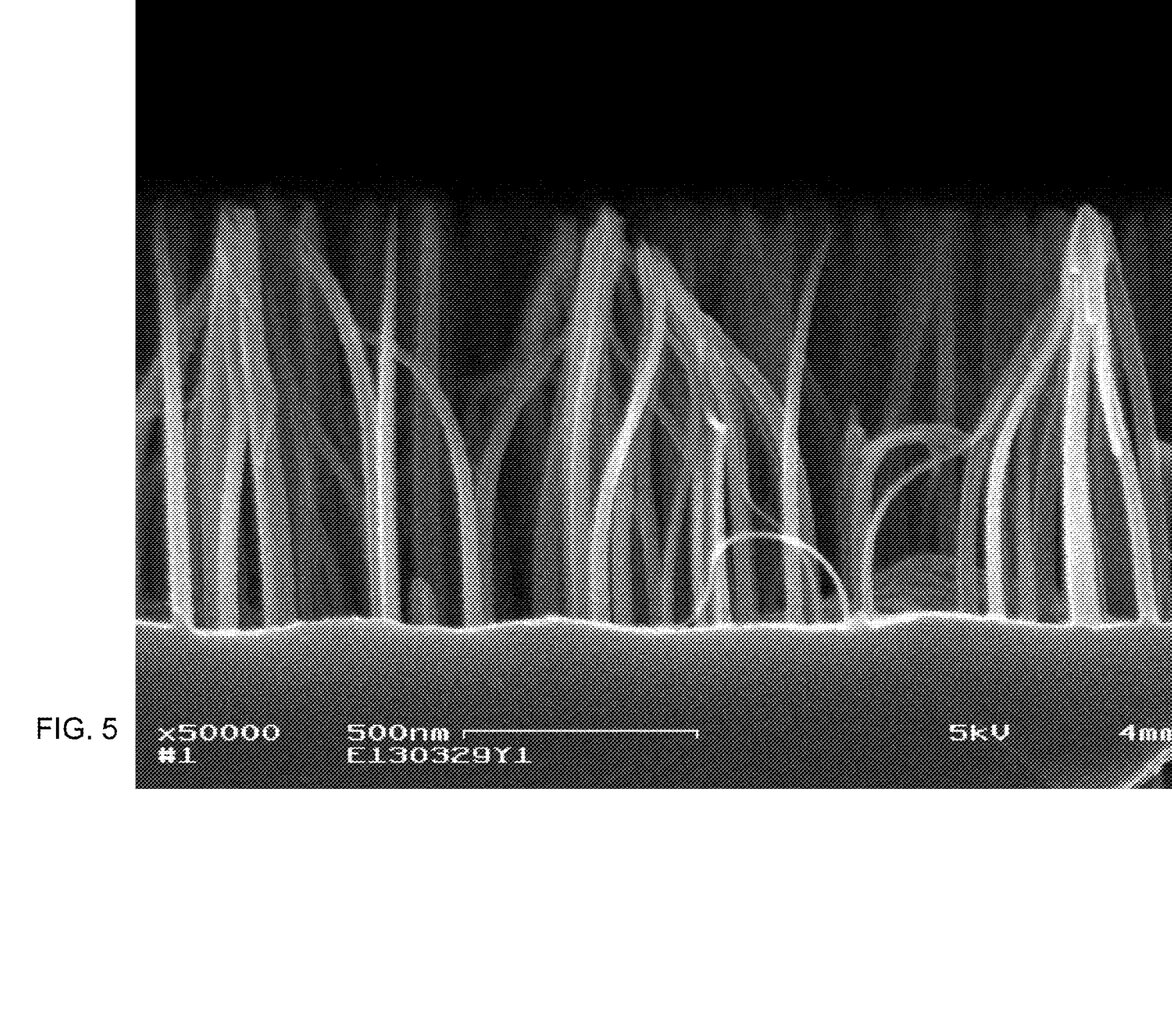
FIG. 5 is an SEM depicting nanowires produced by a process of this disclosure.

FIGS. 3 and 5 depict nanowires produced by processes of this disclosure. FIG. 4 is a flowchart showing in overview some of the steps of the processes of this disclosure.

First Exemplary Process

We used silicon wafers with a resistivity of 1-5 ohm-cm with a (100) crystallographic orientation and p-type doping. The wafers were semiconductor grade single sided CMP.

The wafers are placed into a sputtering chamber for the deposition of the first layer of silver. The base pressure in the chamber is pumped down to $7.0 \times 10^{-7}$ Torr and then 4.77 nm of silver (Ag) is sputter deposited on the front of the wafer at a rate of 2.0 Å/s at a pressure of 5 mTorr and an argon flow rate of around 130 sccm. The samples are then removed from the chamber.

Figure 1:
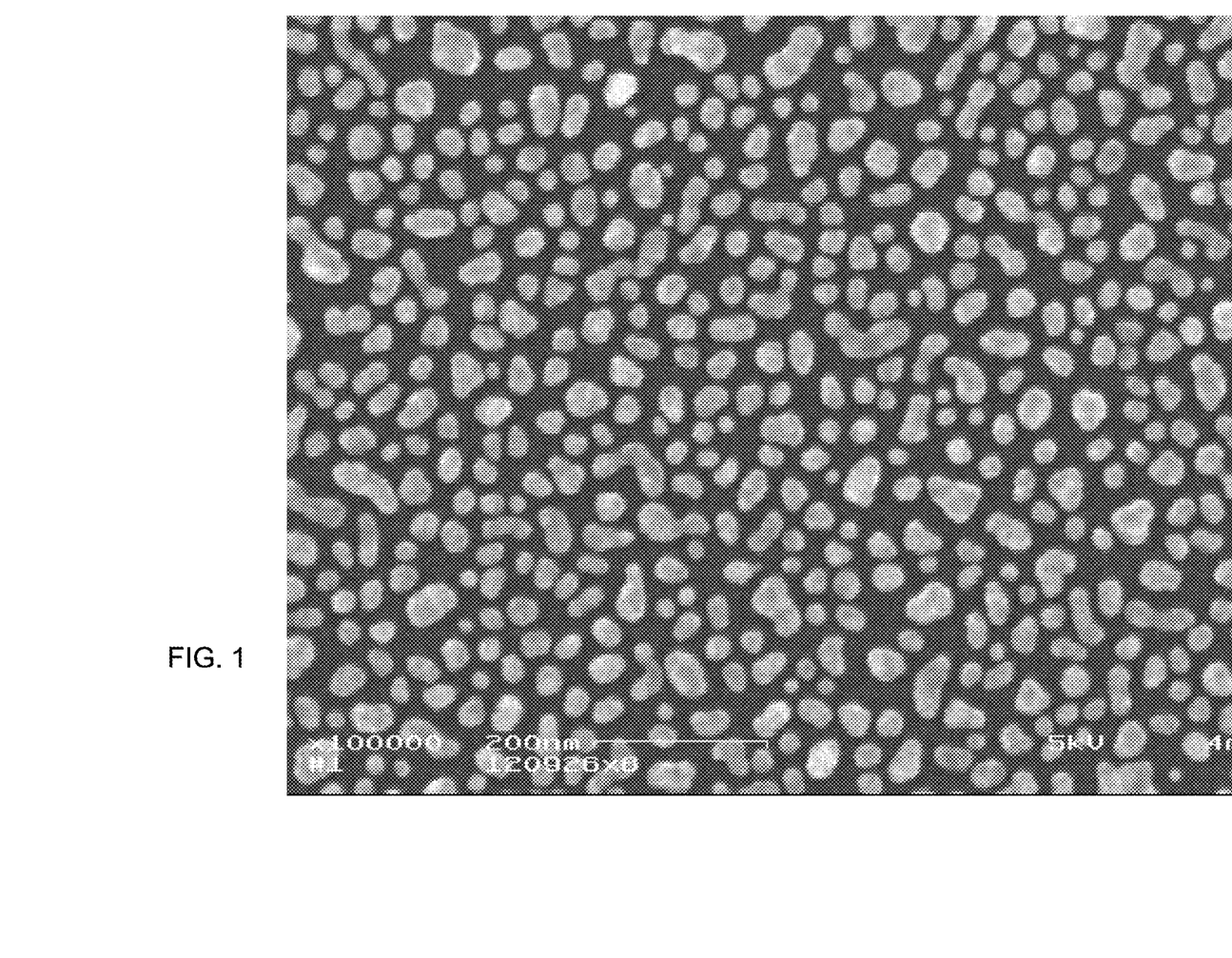
FIG. 1 is an SEM of the silver on the silicon surface after the heating step of the first exemplary process described below.
Figure 2:
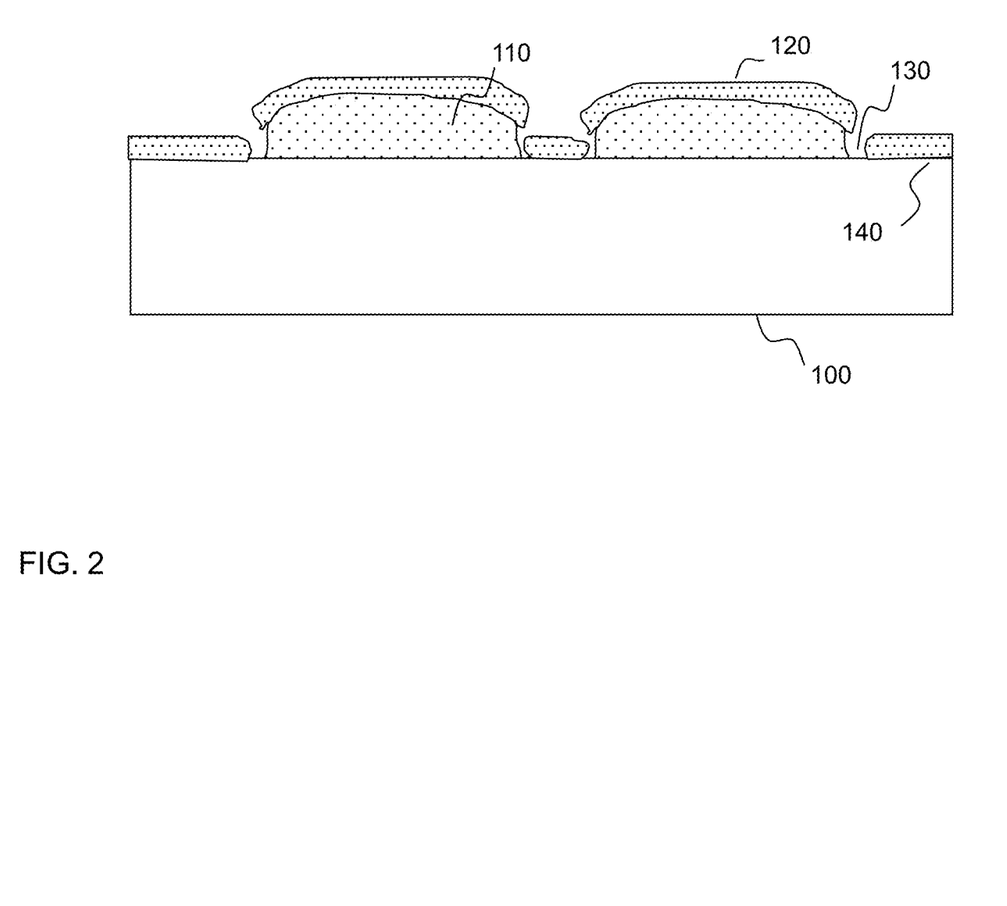
FIG. 2 depicts a schematic cross-section of particles deposited in the first exemplary process described below.

The next step is to heat the layer of metal so that it coalesces and agglomerates on the surface forming into ball-like nanoparticle structures distributed more-or-less evenly on the surface of the wafer. The heating process can be done, for example, in situ in the sputtering tool or the sample can be removed from the sputtering tool and annealed in an oven or a furnace. In this example, the samples were removed from the sputtering tool and placed in a box furnace. The samples were then heated on a quartz plate at 300° C. for 5 minutes. FIG. 1 shows a picture of the silver on the silicon surface after this heating step. When this heating step is performed outside of the sputtering tool, the wafers are then returned to the sputtering chamber. A second silver film is then sputtered onto the front surface. 15 nm of silver was deposited at a rate of about 3.1 Å/s and a pressure of 5 mTorr. This deposition results in coating of both the silver particles and the bare silicon left after the silver has been agglomerated. A schematic of a cross section of the particles is shown in FIG. 2. The silver is very thin in an area immediately surrounding the silver particles from the first deposition, leaving a ring of sparse or bare silicon around each of the silver particles shown, for example, in FIG. 1.

In more detail, FIG. 2 is a schematic cross-section of what is believed to be present once the second layer is deposited. There is a substrate 100. Atop that substrate there are nanoparticles comprising the first metal, such as 110. Atop the nanoparticles there is a layer 120 of the second metal. There are areas like 130 in which the silicon appears to be exposed. Alternatively, even if the silicon is not entirely exposed in areas like 130, the covering of the second metal layer may be quite sparse, thin, and potentially contains holes in such areas. The areas 130 are adjacent to areas like 140 in which the silicon is more fully covered by the second metal.

The wafers are then removed from the sputtering chamber and etched to form nanowires. The nanowire formation occurs in two steps. The first step is an oxygen/HF bath. This etch is less aggressive to the silver film than the second, peroxide etch. Thus the etch process begins and the nanowires are formed while in the less aggressive etch. Furthermore, the second etch described here, if used without the first etch, will tend to create porous silicon at the tips of the nanowires which is non-ideal for some applications. In the latter sentence, the term "porous silicon" refers to material which, viewed in an SEM, has visible cavities and depressions.

After the sample is removed from the sputtering chamber, it is placed in a dilute hydrofluoric acid (HF) bath which contains about 10 parts volume water to 1 part volume HF. Prior to putting the sample in the bath, oxygen is bubbled through the dilute HF at a rate of 21.5 liters per minute for a few minutes. The bubbles are turned off just prior to inserting the sample, then the bubbles are turned on again for the duration of the etch. The samples were etched in the HF bath for roughly 3 minutes.

The next step is the more aggressive silicon etch. This etch is much faster than the first etch and creates long nanowires with minimal taper. The etch bath for this second etch is formed by first making a solution A by mixing 180 mL of water with 20 mL of hydrogen peroxide. Then this solution A is mixed with an additional 40 mL of water and 80 mL of hydrofluoric acid. The wafers are placed directly into this second batch from the first etch bath (no rinse or drying). In this particular example, the wafers were etched for an additional 15 minutes. The wafers are then removed.

The silver can then be removed if required by a 2 minute piranha etch followed by a rinse. The piranha clean consists of a 4:1 mixture of sulfuric acid ($H_2SO_4$): 30 wt % hydrogen peroxide ($H_2O_2$) at 70° C. Prior to placing the wafer in piranha, the bath is stirred for 2 minutes. The stirring can be accomplished by a variety of methods including: bubbling with nitrogen, magnetic stirring, and manual agitation with a stirring rod. The bath may be stirred continuously while the etch is in progress. After the piranha etch, the wafer is rinsed three times with deionized water and then dried with a nitrogen spray gun.

Second Exemplary Process

An alternative embodiment is to skip the first layer of silver and the thermal heating step and directly place an approximately 15 nm film on the silicon wafer. Then perform the metal enhanced etching in dilute HF with bubbled oxygen for approximately 5 minutes and then an etch in peroxide for an additional 15 minutes as described previously. The process is then followed by an optional piranha clean to remove any remaining silver.

Applications

While the nanowires made by the processes of this disclosure can be used in a variety of applications, they are particularly suited to applications in which relatively long and thin nanowires are desired. Such applications include (a) those in which the electronic transition between electronic states is controllably increased (referred to as interface mixing or Bandgap Activation™), (b) silicon nanowire lithium ion battery anodes, and (c) thermoelectric devices.

As regards interface mixing, please see U.S. Pat. No. 7,893,512 to the present assignee, reference (8). In general, interface mixing refers to a situation in which a scalar product of Bloch electron wavefunctions, which would be zero in a bulk crystal (so that the Bloch wavefunctions are orthogonal), becomes nonzero because of the presence of an interface in a crystal which is small (generally nanosized) in at least one dimension. Bloch wavefunctions are explained in many textbooks on solid state physics, for example, reference (6). It is believed that when there is interface mixing, the number of electronic transitions occurring in response to light is changed and may be enhanced.

As regards silicon nanowires in lithium ions batteries, please see reference (7). In general, silicon nanowires have been considerably studied as potential replacements for the anodes in lithium ion batteries, which are currently commonly graphite. Silicon nanowires potentially allow for a higher energy density because a larger number of ions per gram can intercalate into them. However, silicon nanowire technologies have a need to integrate appropriately into current commercial processes for the manufacture of lithium ion batteries, which integration may be assisted by the processes of this disclosure.

A thermoelectric generator may have two electrical terminals and two thermal terminals. The thermal terminals are connected to a hot and a cold source, for example, at 500° C. and 30° C. respectively. A load is connected across the electrical terminals. A current then flows across the load. Roughly and intuitively, the difference in heat between the cold and the hot terminal conveys energy to mobile carriers in the device, which include both electronic carriers and phonons. The energy so conveyed allows electrical carriers to be provided across the load, supplying it with energy. A great many materials experience some degree of thermoelectric effect, but in general only relatively few materials experience this effect to a useful degree such that they can be used in a thermoelectric generator. The use of nanomaterials in thermoelectric generators has been studied, for example in references (3), (4), and (5). Nanomaterials may also be useful in other thermoelectric devices, such as Peltier coolers which are commonly used. In an exemplary Peltier cooling setup, a thermoelectric device uses electric power to create a temperature differential between two planes, causing the cool plane to become colder and the hot plane hotter. If the heat caused by operation of the device can be carried away from the hot plane, e.g., by using a heat sink attached to the hot plane and a common electric fan, a Peltier cooler setup may be a convenient way of producing low temperatures for a particular application.

The following references may be relevant to this application: (1) Sami Franssila, *Introduction to Microfabrication* (2d ed. John Wiley & Sons 2010). (2) U.S. Published Patent Application No. 2009/256134 to the present assignee. (3) Allon I. Hochbaum et al., "Enhanced thermoelectric performance of rough silicon nanowires," *Nature*, vol. 451, p. 163 (2008). (4) Akram I. Boukai et al., "Silicon nanowires as efficient thermoelectric materials," *Nature*, vol. 451, p. 168 (2008). (5) Zhen Li et al., "Semiconductor nanowires for thermoelectrics," *J. Materials Chemistry*, vol. 22, 22821 (2012). (6) Neil W. Ashcroft & N. David Mermin, *Solid State Physics* chapter 8 (1976). (7) U.S. Published Patent Application No. 2012/164529 to Bahr et al. (8) U.S. Pat. No. 7,893,512 to the present assignee. (9) U.S. Pat. No. 8,143,143 to the present assignee. (10) U.S. Published Patent Application No. 2011/24169 to the present assignee.

All patents, patent applications, and publications mentioned in this application are hereby incorporated by reference in their entireties. However, where a patent, patent application, or publication containing express definitions (including definitions made via so-called disclaimer) is incorporated by reference, those express definitions should be understood to apply to the incorporated patent, patent application, or publication in which they are found, and not to the remainder of the text of this application, in particular the claims of this application.

The invention claimed is:

1. A method comprising the steps of: (a) providing a silicon-containing substrate, (b1) depositing a first metal on the substrate, (b2) subjecting the first metal to a treatment which causes the first metal to agglomerate, (b3) depositing a second metal on the substrate, (c) etching the substrate produced by steps (b1)-(b3) using a first etch, and (d) etching the substrate produced by step (c) using a second etch, wherein the second etch is more aggressive towards the deposited first metal than the first etch, wherein the result of step (d) comprises silicon nanowires.

2. The method of claim 1, wherein the first metal deposited comprises silver.

3. The method of claim 1, wherein the first and/or second etch comprises immersion in a solution comprising HF and/or an oxidizer.

4. The method of claim 3, wherein the oxidizer comprises $O_2$.

5. The method of claim 4, wherein the $O_2$ is bubbled through a dilute solution of HF.

6. The method of claim 1, wherein the silicon nanowires are predominantly parallel to each other.

7. The method of claim 1, wherein the silicon nanowires have a cross-section in a plane parallel to the substrate that is approximately round.

8. The method of claim 1, wherein the substrate comprises polycrystalline silicon.

9. The method of claim 1, wherein the substrate comprises metallurgical-grade silicon or silicon metal.

10. The method of claim 1, wherein the silicon nanowires predominantly have their long directions at an angle between 0 and about 45 degrees to a line perpendicular to a surface of the substrate.

11. The method of claim 1, wherein the silicon nanowires predominantly have a long dimension in excess of about 30 µm.

12. The method of claim 1, wherein the silicon nanowires predominantly have cross sections in a plane perpendicular to their long direction which are no more than about 200 nm in diameter.

13. The method of claim 1, wherein the treatment which causes the first metal to agglomerate comprises heating.

14. The method of claim 1, wherein the diameter of the silicon nanowires over the final 10% of their length is less than about 10 nm.

15. The method of claim 1, further comprising the step of employing the silicon nanowires resulting from step (d) in a lithium ion battery anode.

16. The method of claim 1, further comprising the step of employing the silicon nanowires resulting from step (d) in a thermoelectric generator.

17. The method of claim 1, wherein the first metal deposited has a thickness of at least about 10 nm.

18. The method of claim 1, wherein the second metal deposited has a thickness of at least about 10 nm.

19. The method of claim 13, wherein the heating of the first metal involves subjecting the substrate to temperatures in a range between about 200° C. and about 400° C.

20. The method of claim 13, wherein the heating of the first metal involves subjecting the substrate to temperatures in the range for a time between about 2 and about 20 minutes.

* * * * *